United States Patent [19]

Akatsuchi

[11] Patent Number: 5,086,559
[45] Date of Patent: Feb. 11, 1992

[54] ELECTRICAL COMPONENT PLACING APPARATUS AND METHOD OF PLACING ELECTRICAL COMPONENT

[76] Inventor: Kazuyuki Akatsuchi, 19-17, Aobadai 4-chome, Dazaifu-shi, Fukuoka, Japan

[21] Appl. No.: 597,664
[22] Filed: Oct. 17, 1990
[30] Foreign Application Priority Data Oct. 17, 1989 [JP] Japan .................. 1-269352

[51] Int. Cl.$^5$ .................. H05K 3/00; B23P 19/00
[52] U.S. Cl. .................. 29/834; 29/740; 29/833; 228/180.2
[58] Field of Search .................. 29/833, 834, 740; 228/180.2

[56] References Cited

U.S. PATENT DOCUMENTS

| | | | |
|---|---|---|---|
| 3,312,325 | 4/1967 | Beck et al. | 29/740 X |
| 3,337,941 | 8/1967 | Drop | 29/740 X |
| 4,295,596 | 10/1981 | Doten et al. | 228/180.2 |
| 4,372,802 | 2/1983 | Harigane et al. | 29/740 X |
| 4,675,993 | 6/1987 | Harada | 29/740 |
| 4,787,137 | 11/1988 | Jeanmairet et al. | 29/740 |

FOREIGN PATENT DOCUMENTS 2096498 10/1982 United Kingdom .................. 29/740

Primary Examiner—Carl J. Arbes
Attorney, Agent, or Firm—Wenderoth, Lind & Ponack

[57] ABSTRACT

An electrical component placing apparatus has an XY-axis table, including motors for moving the table in the X and Y axis directions between an electrical delivery unit and a printed circuit board. A pick and place head is mounted to the XY-axis table for movement therewith. The pick and place head has a body unit and a nozzle shaft rotatably mounted on the body unit for rotation about a vertical axis. The nozzle shaft has vacuum nozzles disposed on opposite ends thereof for picking and placing electrical components. A motor is operationally connected to the nozzle shaft for rotating the shaft about its axis. A further rotating device rotates the nozzle shaft in the vertical plane about a horizontal axis perpendicular to the vertical plane. A recognition unit is provided for externally recognizing an electrical component after the electrical component has been picked up by the vacuum nozzle and the nozzle shaft has been rotated by the rotating device. The recognition unit detects the amount of correction necessary in the X, Y and rotational directions for correct positioning of the electrical component on a circuit board. The motor connected to the nozzle shaft makes the rotational correction, while the X and Y corrections are made by adjustments in movement of the XY-axis table. Also, the adjustments can be made by a plurality of position restricting pawls which press the side faces of an electrical component.

10 Claims, 5 Drawing Sheets

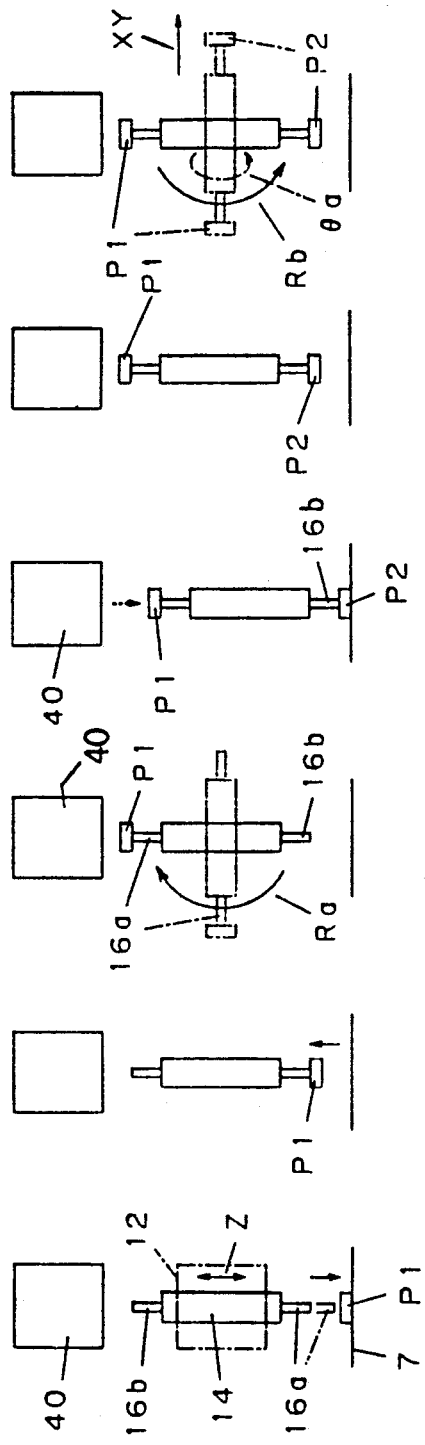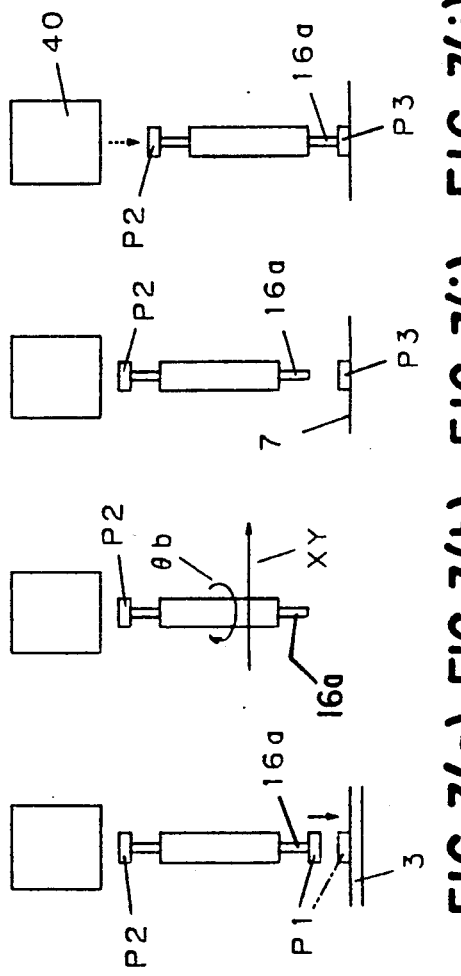
FIG.3(a) FIG.3(b) FIG.3(c) FIG.3(d) FIG.3(e) FIG.3(f)
FIG.3(g) FIG.3(h) FIG.3(i) FIG.3(j)

1 FALLING OF NOZZLE
2 RISING OF NOZZLE
3 PICKUP OF ELECTRICAL COMPONENT
4 PLACING OF ELECTRICAL COMPONENT
5 PICKUP OF IMAGE
6 CALCULATING OF POSITIONAL DEVIATION
7 CORRECTING OF POSITIONAL DEVIATION
8 DETECTING OF CAPACITY

5,086,559

ELECTRICAL COMPONENT PLACING APPARATUS AND METHOD OF PLACING ELECTRICAL COMPONENT

BACKGROUND OF THE INVENTION

1. Field of the Invention

This invention relates to an electrical component placing apparatus and a method of placing an electrical component and, more particularly, to a device for advantageously correcting the deviation of the position of the electrical component picked up and placed by a nozzle.

2. Description of the Prior Art

A conventional electrical component placing apparatus for placing an electrical component such as an IC, an LSI, a resistor chip, and a capacitor chip on a printed circuit board picks up and places an electrical component mounted on a tray feeder, a tape feeder, a tube feeder, etc. with a nozzle of a pick and place head, and places the electrical component on a printed circuit board disposed at a positioning unit.

The electrical component picked up and placed with the nozzle has deviations of its position in directions X, Y and $\theta$, and corrections for the deviations of the position must be made for the component to be placed on the printed circuit board. A conventional positional deviation correcting device of an electrical component is disclosed particularly in FIG. 15 of Japanese Patent Application Laid-Open No. 62-3598. This device mechanically corrects the positional deviation of an electrical component by a chuck device by pressing position restricting pawls from four directions on the sidewall faces of a molded electrical component picked up and placed by a nozzle.

However, since the above-described conventional positional deviation correcting device presses the position restricting pawls on an electrical component to mechanically correct the deviation, there is a problem in that the electrical component may be broken by the impact of pressing and easily damaged. In the case of a QFP (Quad Flat Package) having leads, as the number of leads is increased to a narrow a pitch between the leads, the placing accuracy required is enhanced, but it is difficult to correct the positional deviation of the QFP by the above-mentioned chuck device.

SUMMARY OF THE INVENTION

Accordingly, an object of this invention is to provide an electrical component placing apparatus and a method of placing an electrical component which can advantageously correct the positional deviation of the electrical component picked up by a nozzle while satisfying a requested placing accuracy.

In order to achieve this and other objects according to the present invention, a rotating unit for perpendicularly rotating a nozzle of a pick and place head for picking up an electrical component, and a recognition unit for recognizing the electrical component at the end of the nozzle, moved together with the pick and place head in directions X and Y to be perpendicularly rotated are provided.

With the arrangement described above, an electrical component provided by a delivery unit such as a tape feeder, etc., is picked up at a lower end of the nozzle of the pick and place head, and the nozzle is then rotated perpendicularly by the perpendicularly rotating unit to move the electrical component to the recognition position of the recognition unit, thereby enabling detection of the positional deviation of the electrical component in the directions X, Y and $\theta$.

The nozzle is then rotated perpendicularly to return to its original state. The nozzle is also rotated at an angle $\theta$ at its axial center by an electric motor to correct the positional deviation in the direction $\theta$. An XY-axis table is further driven to so move the pick and place head in the directions X and Y as to correct the positional deviations in the directions X and Y, and the electrical component at the lower end of the nozzle is then placed on a printed circuit board positioned by a positioning unit.

These and other objects and features of the present invention will become apparent from the following detailed description in conjunction with the attached drawings.

BRIEF DESCRIPTION OF THE DRAWINGS

FIGS. 3(a)–3(j) are operational views of the apparatus;

DESCRIPTION OF THE PREFERRED EMBODIMENT

An embodiment of an electrical component placing apparatus according to the present invention will now be described with reference to the accompanying drawings.

Figure 1:
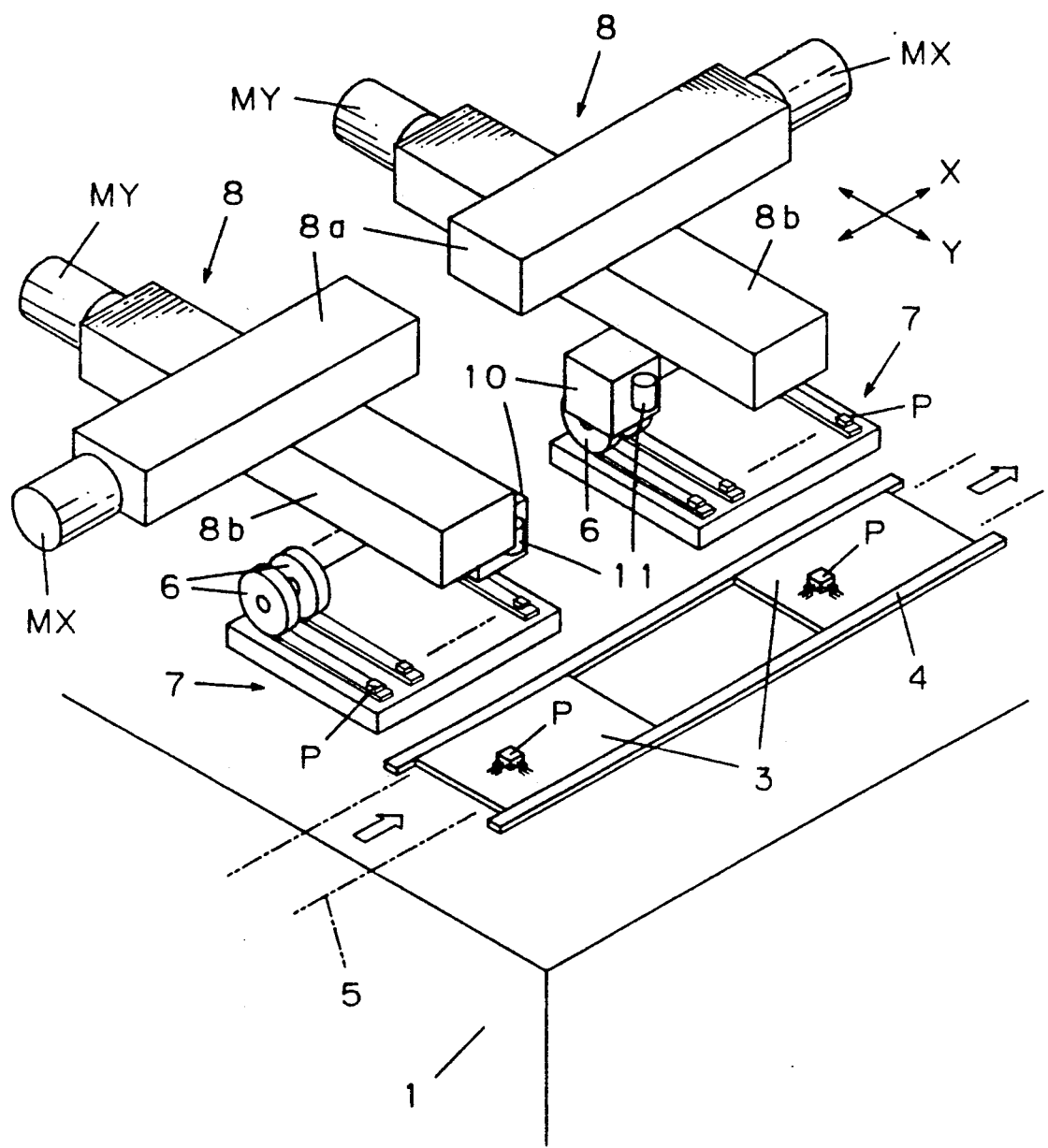
FIG. 1 is a perspective view of an entire electrical component placing apparatus according to an embodiment of the present invention.

FIG. 1 is a perspective view of an electrical component placing apparatus of the invention. The electrical component placing apparatus of the embodiment comprises a body box 1 and a positioning unit 4 for clamping a printed circuit board 3 on the upper surface of the body box 1 to position the printed circuit board 3. A conveyor 5 is provided to convey the printed circuit board 3 to the positioning unit 4 and to convey it out of the positioning unit 4. A delivery unit 7 for electrical components P aligned with tape feeders 6 is provided at the side of the positioning unit 4. The delivery means of the electrical component P includes, for example, in addition to the tape feeder 6, a tray feeder, a tube feeder, etc., generally frequently used per se.

XY-axis tables 8 are provided above the body box 1, each composed of an X-axis table 8a and a Y-axis table 8b to move in directions X and Y by motors MX and MY, respectively. A pick and place head 10 is mounted at the end of the Y-axis table 8b, and a printed circuit board recognition camera 11 is provided thereon. The pick and place head 10 is driven by the XY-axis table 8 to reciprocate between the delivery unit 7 and the printed circuit board 3 positioned by the positioning unit 4 to pick up the electrical component P from the delivery unit 7 and place it on the printed circuit board 3 It is noted that the apparatus of this embodiment may have one XY-axis table 8 and one delivery unit 7. However, in this embodiment, two XY-axis tables 8 and two delivery units 7 are provided to increase the placing efficiency of the electrical components P, thereby simultaneously placing the electrical components P on two printed circuit boards 3.

Figure 2:
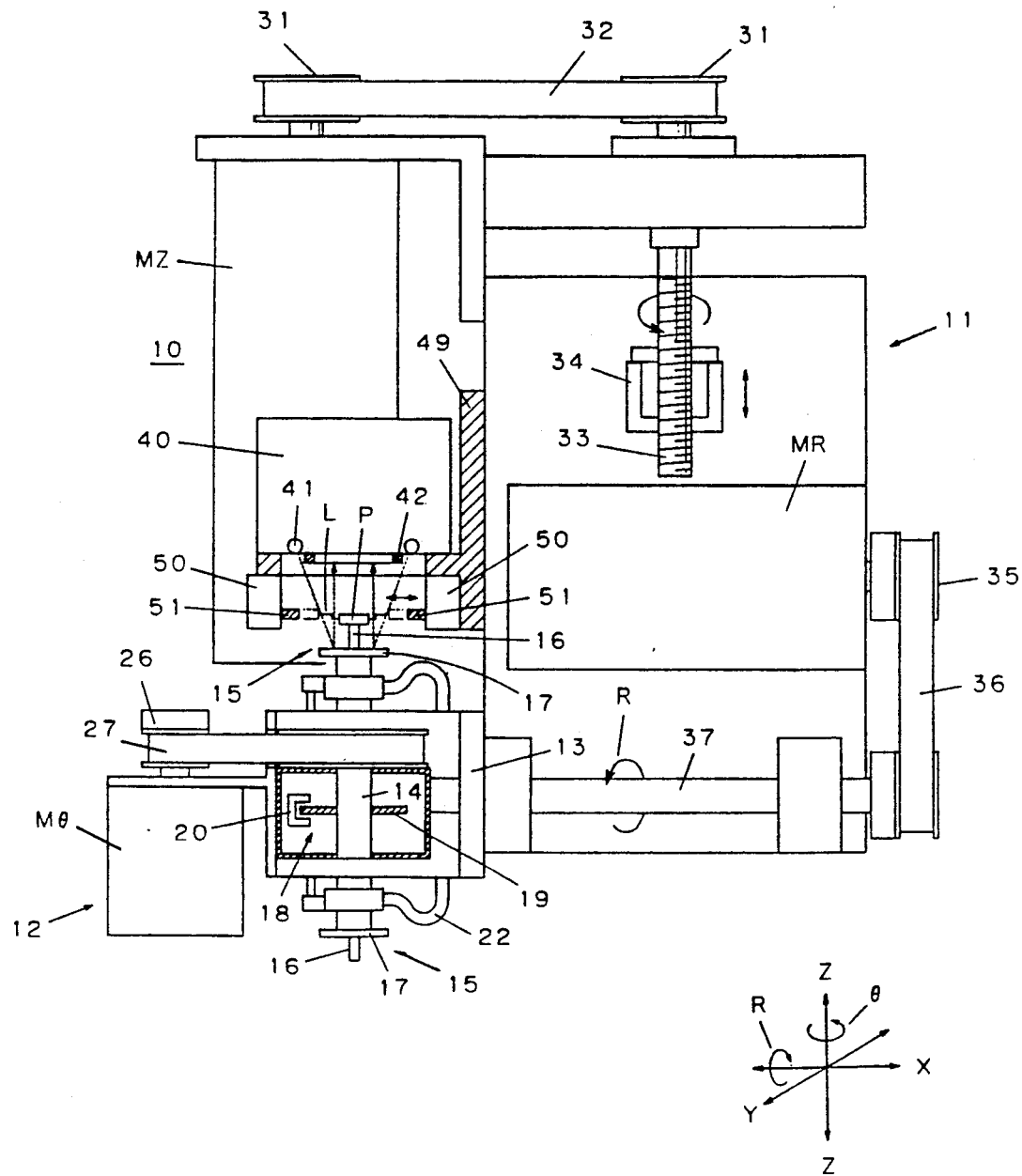
FIG. 2 is a detailed view of a pick and place head.

FIG. 2 shows a detailed structure of the pick and place head 10. The pick and place head 10 has a body unit 11 and a head unit 12 mounted on the body unit 11. The head unit 12 has a bracket 13 on which a nozzle shaft 14 is mounted. Nozzle units 15 are detachably mounted on both ends of the nozzle shaft 14, each having a vacuum nozzle 16 and a light diffuser 17. A suction tube 22 is provided to communicate with the nozzle 16 to pick up an electrical component P on the end of the nozzle 16. An encoder 18 is mounted on the body of the nozzle shaft 14, and has a rotary plate 19 and a photoelectric element 20 to rotate integrally with the nozzle shaft 14 to detect the rotating amount thereof.

A motor $M\theta$ is associated integrally with the head unit 12 to rotate the nozzle shaft 14 with its axial center as a center of rotation at an angle $\theta$ through transmission means such as a pulley 26, a timing belt 27, etc. The correction of the electrical component P picked up by the nozzle 16 in the direction $\theta$ is performed by driving the motor $M\theta$ to rotate the nozzle shaft 14 and the nozzle 16 in the direction $\theta$. The rotating amount of the electrical component P is detected by the encoder 18, and the output signal of the encoder 18 is fed back to the motor $M\theta$, thereby controlling the rotating amount of the motor $M\theta$.

In this connection, the encoder of a conventional electrical component placing apparatus is associated integrally with a motor, and the rotating amount of the motor is controlled by the encoder to rotate the electrical component at a predetermined angle $\theta$. However, the rotation of the motor is not correctly transmitted to the electrical component due to backlashes of the pulley, the timing belt or transmission means such as gears, etc., and thus a command value, i.e., the rotating amount of the motor, does not, erroneously, coincide with the effective value, i.e., the rotating amount of the electrical component, the electrical component cannot be rotated accurately at the predetermined amount $\theta$, and there arises a problem that the placing accuracy of the electrical component is deteriorated that much.

However, according to the embodiment of the invention, the encoder 18 is associated integrally with the nozzle shaft 14 to detect the rotating amount of the nozzle shaft 14, i.e., the rotating amount of the electrical component P, and the rotating amount of the motor $M\theta$ is controlled by the output signal of the encoder 18. Accordingly, even if the transmission components 26 and 27 have backlashes, the electrical component P can be accurately rotated the predetermined amount $\theta$, to and thus placing accuracy is increased.

A Z-axis motor MZ is associated with the body unit 11 to rotate a ball screw 33 vertically mounted on the body unit 11 through a pulley 31 and a timing belt 32. A nut 34 is engaged with the ball screw 33. When the motor MZ is driven, the nut 34 is vertically driven up and down along the ball screw 33, thereby vertically moving up or down the body unit 11 (in the direction Z).

A motor MR is disposed in the body unit 11 to rotate a horizontal shaft 37 through a pulley 35 and a timing belt 36. The bracket 13 of the head unit 12 is attached to the end of the shaft 37. When the motor MR is driven, the head unit 12 is rotated perpendicularly R with the shaft 37 as a center. Accordingly, the nozzle 16 is thus rotated perpendicularly R to be inverted vertically. In other words, the members MR, 35, 36 and 37 constitute a perpendicularly rotating unit for rotating the nozzle 16 perpendicularly R.

A camera 40 is provided as a recognition unit mounted on a bracket 49 provided on the body unit 11 to move integrally with the head unit 12 in the directions X, Y and Z, and a ring-shaped light source 41 is provided to radiate a light toward the electrical component P positioned at the recognition position of the camera 40. The positional deviation of the electrical component P is recognized by the scattered light diffused to the light diffuser 17. The camera 40 includes, for example, a CCD camera, a camera having a linear image sensor, etc. A ring-shaped shielding plate 42 is provided to prevent any unnecessary light from irradiating the electrical component P and thinning the image with the reflected light.

A driving case 50 is mounted on the lower surface of the bracket 49, and position restricting pawls 51 are telescopically moved horizontally from the driving case 50. The position restricting pawls 51 are disposed at four sides of the electrical component P picked up by the upper end of the nozzle 16 to project toward the electrical component P, thereby pressing the ends of the leads L of the electrical component P from four directions to correct the positional deviations of the electrical component P in the directions X, Y and $\theta$. More specifically, the positional restricting pawls 51 are similar to those described in the previous paragraph of the prior art, and the method of use thereof will be described later.

The embodiment of the apparatus of the invention is constructed as described above, and the operation of the apparatus will be described with reference to FIGS. 3(a) to 3(j).

When the pick and place head 10 is driven by the XY-axis table 8 to be moved above the delivery unit 7 and the motor MZ is then actuated, the head unit 12 is moved vertically up or down to pick up the electrical component P at the lower end of one nozzle 16a (FIGS. 3(a) and 3(b)).

Then, the motor MR is driven to rotate the nozzle shaft 14 perpendicularly Ra 180° to vertically invert the upper and lower nozzles 16a and 16b (FIG. 3(c)). Subsequently, the head unit 12 is again moved vertically up or down to pick up next electrical component P with the other nozzle 16b (FIGS. 3(d) and 3(e)). When the nozzle 16b is moved vertically as described above to pick up the electrical component P, the camera 40 recognizes the electrical component P picked up by the one nozzle 16a while integrally moving vertically with the head unit 12 to detect the positional deviations of the electrical component P in the directions X, Y and $\theta$.

Then, the motors MX and MY are driven to move the head unit 12 toward the printed circuit board 3 of the positioning unit 4 in the directions X and Y. In this case, the motor MR is rotated reversely to rotate the nozzle shaft 14 perpendicularly Rb, and the upper and lower nozzles 16a and 16b are again inverted vertically. The motor $M\theta$ is driven to rotate the nozzle shaft 14 in the direction $\theta$a to correct the positional deviation of the electrical component P1 in the direction $\theta$ (FIG. 3(f)). In this case, as described above, the encoder 18 detects the rotating amount of the nozzle shaft 14 to control the motor $M\theta$ according to the detected result, thereby rotating the electrical component P a predetermined amount $\theta$ to accurately correct the positional deviation of the electrical component P.

The motors MX and MY are supplemental with correction values based on the positional deviations of the electrical component P1 in the directions X and Y to be driven, thereby correcting the positional deviations in the directions X and Y. Thus, the electrical component P1 is fed to a position directly above the printed circuit board 3. Then, the head unit 12 is vertically moved to place the electronic component P1 on the printed circuit board 3 (FIG. 3(g)).

Subsequently, the head unit 12 is moved in the directions X and Y to be returned onto the delivery unit 7 (FIG. 3(h)). In this case, the motor $M\theta$ is driven to rotate the nozzle shaft 14 in the direction $\theta b$ opposite to the direction $\theta a$, thereby initializing the position of the nozzle shaft 14 in the direction $\theta$. Then, the head unit 12 is again vertically moved to pick up a third electrical component P3 by the nozzle 16a (FIGS. 3(i) and 3(j)). In this instance, the positional deviation of the electrical component P2 picked up by the other nozzle 16b is recognized by the camera 40. Similarly, the electrical components P2, P3, . . . are sequentially transferred to and placed on the printed circuit board 3.

Figure 4:
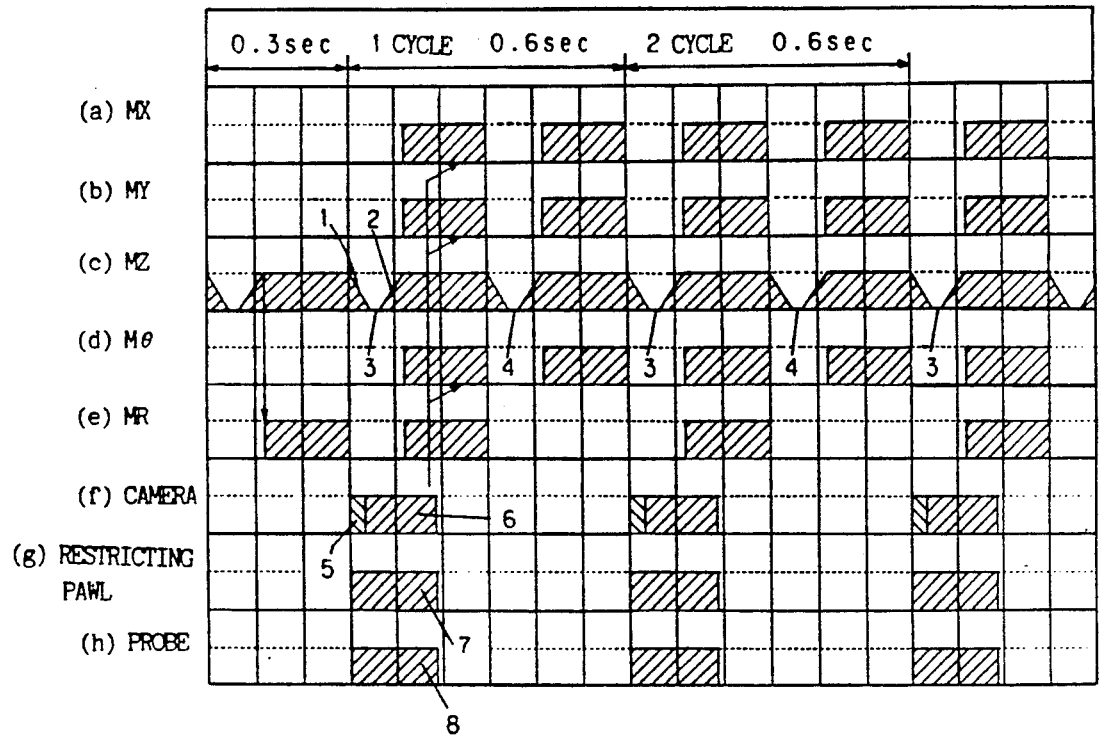
FIG. 4 is a time chart of the apparatus.

In FIG. 4, showing the time chart of the above operation, (a) to (f) are cycle times of 0.6 sec. (where the first cycle time is 0.3 sec.). As is apparent from FIG. 4, the cycle times are fundamentally determined according to the operating times of the motors MX, MY and MZ. The calculating times, such as the operating times of the other motors $M\theta$ and MR', the image pickup time of the camera 40, positional deviation, etc., are associated with the operating times of the motors MX, MY, MZ to so shorten the cycle time that the image pickup and calculating times and the time required for $\theta$-correction based on the recognition result do not become dead times.

A method of using the position restricting pawls 51 will be described.

The size of the visual field of the camera 40 is limited. If the electrical component P is excessively large, it is impossible to detect the positional deviation of the electrical component P by recognizing it in the visual field of the camera 40. Accordingly, in such a case, the detection of the positional deviation of the electrical component P by the camera 40 is not executed, but the position restricting pawls 51 project to press the ends of the leads L to correct the positional deviation of the electrical component P in the directions X, Y and $\theta$. (FIG. 2). In this case, since the positional accuracy is obtained for not the molded body but the lead L landed on the electrode of the printed circuit board, the position restricting pawls 51 are pressed to the end of the leads L to correct the positional deviation of the ends of the lead L. In this connection, since the conventional device presses the position restricting pawls on the molded body, it has a disadvantage that the correcting accuracy is not improved. If the position restricting pawls 51 are provided in the invention as described above, the positional deviation can be corrected by the positional restricting pawls 51 without the camera 40 even in an apparatus having a low requested positional accuracy. Particularly, since the device of the invention reciprocates between the delivery unit 7 and the printed circuit board 3 while vertically inverting the nozzle shaft 14 to restrict the electrical component P, it is possible to sufficiently provide the operating time of the position restricting pawls 51 and to hence slowly project the positional restricting pawls 51, thereby softly pressing them on the electrical component P. Accordingly, the potential breakdown or damage of electrical components P can be eliminated to that degree. When the camera 40 and the position restricting pawls 51 are provided as described above, the positional deviation of the electrical component P can be advantageously corrected while responding to the type and size, etc., of the electrical component. FIG. 4(g) shows the operating timing of the position restricting pawls 51. This timing is the same as that of the image pickup with the camera 40 or calculation of the positional deviation.

Another embodiment of an electrical component placing apparatus according to the invention will be described. Some capacitor chips, resistor chips, etc. to be mounted on a printed circuit board do not have a predetermined capacity. To this end, after they are placed on the printed circuit board, their capacity is inspected by a multimeter. However, it is disadvantageous to inspect the capacity in a separate step, due to an increase in the numbers of operating steps. If the inspected result represents a malfunction, the printed circuit board must be abandoned, or the malfunctioning chip must be removed, and placing should be again performed.

Figure 5:
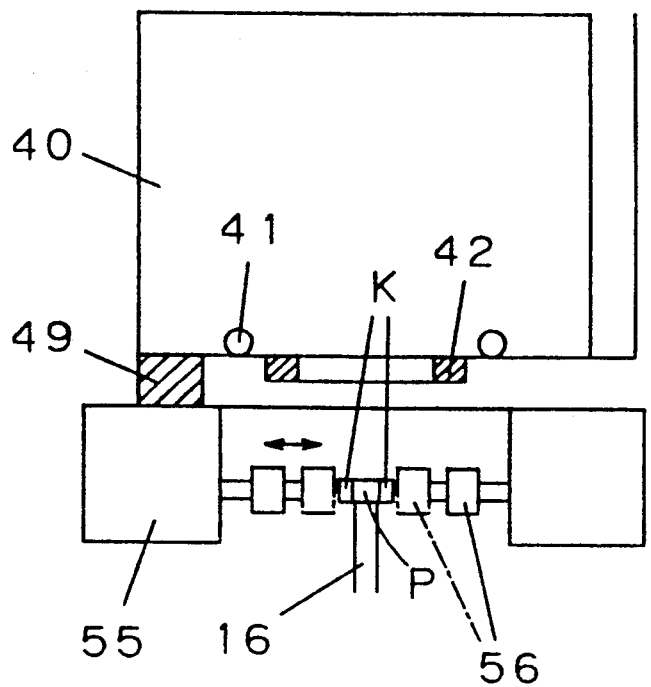
FIG. 5 is a side view of a capacity inspecting device.

FIG. 5 shows a device for solving the problem of the conventional device. Probes 56 are horizontally telescopically provided instead of the position restricting pawls 51. In this device, a driving case 55 is provided. Accordingly, the probes 56 are projected to be pressed on the electrodes K of both sides of a chip P, inverted vertically, to detect the capacity of the chip P. In case the inspection reveals a malfunction, the chip is not placed but can be recovered. The right and left conventional restricting pawls 51 corresponding to the electrodes K may be employed as the probes. FIG. 4(h) shows the operation timing of the probes 56. As is apparent from FIG. 4, the operation timing of the probe 56 may be set within the cycle time. Accordingly, the placing speed for the time required for inspecting the capacity is not decelerated.

The apparatus of the present invention can be modified variously within the scope of the invention. For example, in the embodiment described above, the nozzle 16 is rotated at 180° to be vertically inverted. However, if the disposing space of the camera 40 is allowable, it may be rotated at 90°, and the electrical component may be recognized by the camera 40 from lateral direction. Thus, the rotating angle of the nozzle 16 is not limited to 180°.

In the embodiment described above, two nozzles 16 are provided at both ends of the nozzle shaft 14. However, if a slight decrease in the operating efficiency is allowed. The nozzle 16 may be provided only at one end of the nozzle shaft 14. Then, the recognition of the camera 40, the pickup and placing of the electrical component P may be performed while vertically rotating the nozzle shaft 14. Further, the nozzle 15 may be detachably provided to be replaced in response to the modification of the type of the electrical component P.

According to the present invention as described above, the positional deviation of the electrical component may be accurately corrected. The recognition of the positional deviation of the electrical component and correction of the positional deviation based on the recognition result may be performed during the timing of moving the pick and place head in the directions X, Y, Z. Therefore, the times required for the recognition and the correction do not become dead time, but rather the cycle time is shortened to place the electrical component on the printed circuit board at a high accuracy and at a high speed. Further, the correction of the positional deviation of large-sized electrical components not seen by the visual field of the recognition unit can be performed, and the inspection of the capacity of a capacitor chip, a resistor chip, etc. maybe performed within the cycle time.

What is claimed is:

1. An electrical component placing apparatus, comprising:
   an XY-axis table comprising means for moving said table in the X and Y axis directions between an electrical component delivery unit and a printed circuit board; and
   a pick and place head mounted to said XY-axis table for movement therewith, said pick and place head comprising:
      a pick and place head body unit,
      a nozzle shaft rotatably mounted on said pick and place head body unit for rotation about an axis extending in a vertical plane, said nozzle shaft having vacuum nozzles on opposite ends thereof for picking and placing electrical components,
      a motor operationally connected to said nozzle shaft for rotating said nozzle about said axis,
      a rotating means for rotating said nozzle shaft in said vertical plane about a horizontal axis perpendicular to said vertical plane, and
      a recognition means for externally recognizing an electrical component after the electrical component has been picked up by a said vacuum nozzle and said nozzle shaft has been rotated by said rotating means.

2. An electrical component placing apparatus, comprising:
   an XY-axis table comprising means for moving said table in the X and Y axis directions between an electrical component delivery unit and a printed circuit board; and
   a pick and place head mounted to said XY-axis table for movement therewith, said pick and place head comprising:
      a pick and place head body unit,
      a nozzle shaft mounted on said pick and place head body unit, said nozzle shaft having vacuum nozzles on opposite ends thereof for picking and placing electrical components,
      a rotating means for rotating said nozzle shaft in said vertical plane about a horizontal axis perpendicular to said vertical plane, and
      positioning means comprising a plurality of position restricting pawls for pressing side faces of an electrical component after the electrical component has been picked up by a said vacuum nozzle and said nozzle shaft has been rotated by said rotating means to correct positional deviations of the electrical component in the X, Y and rotational directions.

3. An electrical component placing apparatus, comprising:
   an XY-axis table comprising means for moving said table in the X and Y axis directions between an electrical component delivery unit and a printed circuit board; and
   a pick and place head mounted to said XY-axis table for movement therewith, said pick and place head comprising:
      a pick and place head body unit,
      a nozzle shaft mounted on said pick and place head body unit, said nozzle shaft having vacuum nozzles on opposite ends thereof for picking and placing electrical components,
      a rotating means for rotating said nozzle shaft in said vertical plane about a horizontal axis perpendicular to said vertical plane, and
      probe means comprising a plurality of probes for pressing side faces of an electrical component after the electrical component has been picked up by a said vacuum nozzle and said nozzle shaft has been rotated by said rotating means and detecting characteristics of the electrical component.

4. An electrical component placing apparatus, comprising:
   an XY-axis table comprising means for moving said table in the X and Y axis directions between an electrical component delivery unit and a printed circuit board; and
   a pick and place head mounted to said XY-axis table for movement therewith, said pick and place head comprising:
      a pick and place head body unit,
      a nozzle shaft mounted on said pick and place head body unit for rotation about its axis having a vacuum nozzle at a lower end thereof,
      a motor for rotating said nozzle shaft about its axis on said pick and place head body unit having a transmission means for transmitting rotation produced by said motor to said shaft, and
      an encoder means connected to said nozzle shaft for directly detecting the amount of rotation of said nozzle shaft, producing an output signal controlling the amount of rotation of said motor in response to said output signal.

5. An electrical component placing apparatus, comprising:
   an XY-axis table comprising means for moving said table in the X and Y axis directions between an electrical component delivery unit and a printed circuit board;
   a pick and place head mounted to said XY-axis table for movement therewith, said pick and place head comprising:
      a pick and place head body unit,
      a nozzle shaft rotatably mounted on said pick and place head body unit for rotation about an axis extending in a vertical plane, said nozzle shaft having vacuum nozzles on opposite ends thereof for picking and placing electrical components;
      a motor operationally connected to said nozzle shaft for rotating said nozzle about said axis,
      a rotating means for rotating said nozzle shaft in said vertical plane about a horizontal axis perpendicular to said vertical plane,
      a recognition means for externally recognizing an electrical component after the electrical component has been picked up by a said vacuum nozzle and said nozzle shaft has been rotated by said rotating means.
      positioning means comprising a plurality of position restricting pawls for pressing side faces of an electrical component after the electrical component has been picked up by a said vacuum nozzle and said nozzle shaft has been rotated by said rotating means to correct positional deviations of the electrical component in the X, Y and rotational directions.

6. The apparatus of claim 5, wherein:

said pawls of said positioning means comprise probes for detecting characteristics of the electrical component.

7. The apparatus of claim 5, wherein:
said pick and place head comprises a drive means for driving said vacuum nozzles perpendicularly to the X and Y directions for picking up and placing electrical components.

8. The apparatus of claim 5, wherein:
said rotating means comprises a motor, transmission and rotating shaft mounted on said pick and place head body unit; and
a bracket rotatably mounts said nozzle shaft, said bracket being connected to one end of said rotating shaft of said rotating means.

9. The apparatus of claim 5, wherein:
said recognition means comprises a camera mounted on said pick and place head body unit, a light source mounted with said camera, and a light diffuser mounted on said vacuum nozzles.

10. A method of placing an electrical component, comprising the steps of:
providing an XY-axis tale comprising means for moving said table in he X and Y axis directions between an electrical component delivery unit and a printed circuit board and a pick and place head mounted to said XY-axis table for movement therewith, said pick and place head comprising a pick and place head body unit, a nozzle shaft rotatably mounted on said pick and place head body unit for rotation about an axis extending in a vertical plane, said nozzle shaft having a vacuum nozzle on a lower end thereof, a motor operationally connected to said nozzle shaft for rotating said nozzle shaft about said axis, a rotating means for rotating said nozzle shaft in said vertical plane about a horizontal axis perpendicular to said vertical plane, and a recognition unit;

picking up an electrical component from a delivery unit with said vacuum nozzle;

rotating said nozzle shaft with said rotating means to move the electrical component to a recognition position of axis having a vacuum nozzle at a lower end thereof, a motor for rotating said nozzle shaft about its axis on said pick and place head body unit having a transmission means for transmitting rotation produced by said motor to said shaft, and an encoder means connected to said nozzle shaft for directly detecting the amount of rotation of said nozzle shaft, producing an output signal controlling the amount of rotation of said motor in response to said output signal.

* * * * *